United States Patent
Tehrani

(10) Patent No.: US 10,978,629 B2
(45) Date of Patent: Apr. 13, 2021

(54) METHOD OF DISPERSING NANOPARTICLES IN DIFFERENT MEDIUMS AND METHODS TO ACHIEVE SUPERIOR THERMOELECTRIC PERFORMANCES IN CARBON NANOTUBE POLYMER SYSTEMS

(71) Applicant: UNM RAINFOREST INNOVATIONS, Albuquerque, NM (US)

(72) Inventor: Mehran Tehrani, Albuquerque, NM (US)

(*) Notice: Subject to any disclaimer, the term of this patent is extended or adjusted under 35 U.S.C. 154(b) by 535 days.

(21) Appl. No.: 15/527,699

(22) PCT Filed: Dec. 7, 2015

(86) PCT No.: PCT/US2015/064281
§ 371 (c)(1),
(2) Date: Aug. 10, 2018

(87) PCT Pub. No.: WO2016/090363
PCT Pub. Date: Jun. 9, 2016

(65) Prior Publication Data
US 2018/0331270 A1    Nov. 15, 2018

Related U.S. Application Data

(60) Provisional application No. 62/088,303, filed on Dec. 5, 2014, provisional application No. 62/088,310, filed on Dec. 5, 2014.

(51) Int. Cl.
*H01L 35/24* (2006.01)
*H01L 35/34* (2006.01)
(Continued)

(52) U.S. Cl.
CPC ............. *H01L 35/24* (2013.01); *C08J 3/212* (2013.01); *C08J 7/0423* (2020.01); *C08K 3/041* (2017.05);
(Continued)

(58) Field of Classification Search
CPC ......... H01L 35/24; H01L 35/34; C08K 3/041; C08K 3/08; C08K 3/22; C08J 3/212; C08J 7/045
See application file for complete search history.

(56) References Cited

U.S. PATENT DOCUMENTS

2005/0239948 A1* 10/2005 Haik ................. B29C 67/24
524/496
2011/0042276 A1   2/2011 Miller
(Continued)

FOREIGN PATENT DOCUMENTS

WO    WO 2013/123023 A2    8/2013

OTHER PUBLICATIONS

Cho (PCT Officer), "PCT International Search Report and PCT Written Opinion of the International Searching Authority," dated Apr. 19, 2016, 10 pgs.

*Primary Examiner* — Jayne L Mershon
(74) *Attorney, Agent, or Firm* — MH2 Technology Law Group LLP

(57) ABSTRACT

Provided herein is a method for forming a composite. The method can include mixing a plurality of carbon nanotubes (CNTs) and a plurality of magnetic nanoparticles in a non-polar medium. At least some of the plurality of CNTs form entangled CNTs. The method also includes attaching first ones of the plurality of magnetic nanoparticles to exposed surfaces of the entangled CNTs; disentangling the entangled CNTs to form a plurality of dispersed CNTs; and aligning the plurality of dispersed CNTs. The disentangling
(Continued)

of the entangled CNTs to form a plurality of dispersed CNTs includes exposing the plurality of magnetic nanoparticles and the plurality of entangled CNTs to electromagnetic energy.

20 Claims, 7 Drawing Sheets

(51) Int. Cl.
  *C08J 3/21*   (2006.01)
  *C08J 7/04*   (2020.01)
  *C08K 3/04*   (2006.01)
  *C08K 3/08*   (2006.01)
  *C08K 3/22*   (2006.01)
  *B82Y 30/00*   (2011.01)
  *B82Y 40/00*   (2011.01)

(52) U.S. Cl.
  CPC ............... *C08K 3/08* (2013.01); *C08K 3/22* (2013.01); *H01L 35/34* (2013.01); *B82Y 30/00* (2013.01); *B82Y 40/00* (2013.01); *C08J 2481/08* (2013.01); *C08K 2003/085* (2013.01); *C08K 2003/0856* (2013.01); *C08K 2003/0862* (2013.01); *C08K 2003/2265* (2013.01); *C08K 2003/2289* (2013.01); *C08K 2003/2293* (2013.01); *C08K 2201/01* (2013.01); *C08K 2201/011* (2013.01)

(56) References Cited

U.S. PATENT DOCUMENTS

| | | |
|---|---|---|
| 2011/0204020 A1 | 8/2011 | Ray et al. |
| 2013/0142987 A1* | 6/2013 | Wardle ............... B82B 1/00 428/98 |
| 2013/0280515 A1 | 10/2013 | Daraio et al. |
| 2014/0338715 A1* | 11/2014 | Grunlan ............... H01L 35/22 136/205 |
| 2016/0079509 A1* | 3/2016 | Grayson ............... H01L 35/32 136/238 |

* cited by examiner

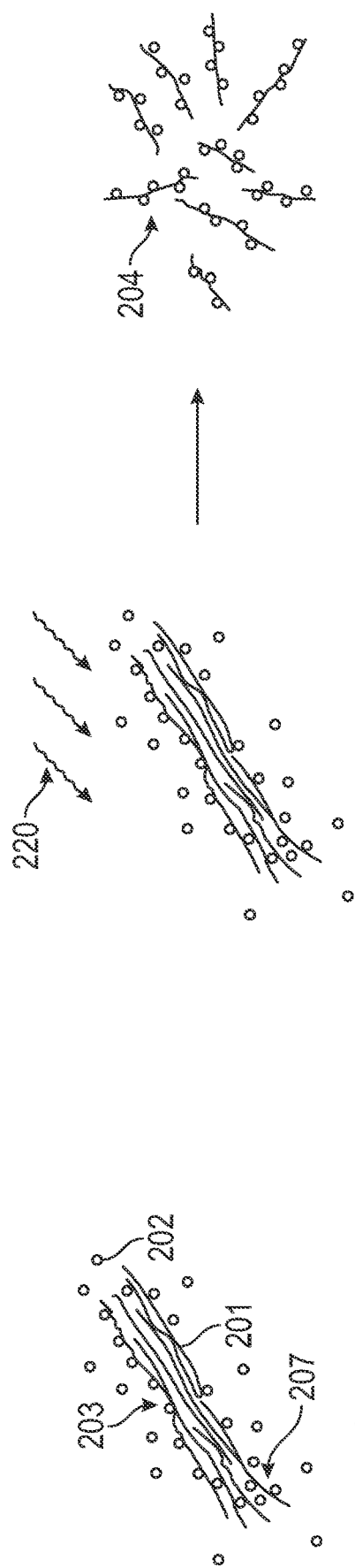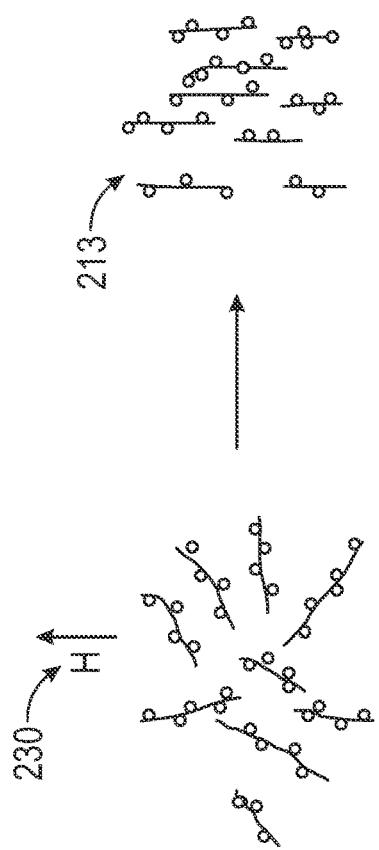
FIG. 2A
FIG. 2B
FIG. 2C

METHOD OF DISPERSING NANOPARTICLES IN DIFFERENT MEDIUMS AND METHODS TO ACHIEVE SUPERIOR THERMOELECTRIC PERFORMANCES IN CARBON NANOTUBE POLYMER SYSTEMS

CROSS-REFERENCE TO RELATED APPLICATIONS

This application claims priority to PCT Patent Application No. PCT/US2015/064281 filed on Dec. 7, 2015, which claims priority to U.S. Provisional patent application Ser. No. 62/088,310 filed Dec. 5, 2014, the entirety of which is hereby incorporated by reference.

FIELD

This invention relates generally to the field of composites, in particular, carbon-nanotube-reinforced composites and methods of making such composites.

BACKGROUND

Nanocomposites

A single carbon nanotube has extraordinary mechanical properties, exhibiting a tensile strength of up to 100 times that of high strength steels and a stiffness that is 5 times larger than steel. Thus, one would intuitively expect that the addition of minute amounts of CNTs to another material (to form a so called 'nanocomposite') should result in significant improvements in the mechanical properties. Indeed, mathematical models predict an order-of-magnitude increase in the stiffness of polymers upon adding only 1% by volume of randomly distributed CNTs.

Fiber reinforced polymer composites (FRP) are made from continuous and aligned microfibers that are held together by a polymer matrix. FRPs possess very high in-plane strength and stiffness-to-weight ratio. For instance, carbon fiber reinforced composites are three times stronger than steel at the same weight. However, FRPs lack mechanical performance in the cross-plane direction. FRPs are widely used in many applications including automotive, aerospace, and civil infrastructure industries. Contrary to metallic structures, components made form FRP lack plastic deformation prior to failure and thus experience an abrupt failure. Most importantly, delamination and polymer matrix cracking in composites are usually not predictable, resulting in very conservative designs and frequent inspection of FRP structures. Such problems remain the challenges in the art.

Considering the relatively low price of industrial grade CNTs, which can be used as reinforcement in structures (~$100 per kilogram), they are theoretically the ideal filler for nanocomposites. In fact, the addition of 1% by weight of randomly distributed CNTs to the matrix of an FRP improves impact resistance, strain to failure and off-axis strength by 21%, 12% and 20%, respectively, compared to conventional epoxy FRP. Further, CNTs are capable of eliminating fatigue limitations of glass fiber reinforced polymers. Importantly, addition of small amounts of CNTs to conventional FRPs significantly improves polymer matrix and delamination crack resistance.

However, nanocomposites suffer some shortcomings. Primarily, groups CNTs 101 may become entangled to form side-by-side assemblies of nanotubes, such as bundles 103, 105, and entangled bundles, such as aggregates, as shown in FIG. 1A, due to their high surface area (up to 1000 m²/gram) and large aspect ratio (up to $10^6$). Breaking down these usually micro-sized aggregates are very challenging and their existence in a nanocomposite 100 is detrimental to the mechanical properties (where they act as defects). Lab-scale techniques have overcome this limitation for CNTs only in solution form by the means of low throughput techniques, such as tip ultrasonication. Secondly, the addition of CNTs to polymers 107 exponentially increases the viscosity, making the polymer practically unsuitable for processing above ~0.5% CNT loadings. This has considerably limited the industrial use of CNTs in epoxy polymers.

Despite the great promise of carbon nanotubes (CNTs) for many engineering applications, scalable methods to effectively disperse nanotubes and control their alignment in a matrix, such as a polymer matrix, have not been realized. These limitations have greatly limited the widespread use of carbon nanotubes, especially for structural applications.

To alleviate this drawback, CNT alignment can be utilized to achieve the desired mechanical properties in preferred directions, while requiring much less nanotube loadings. For example, as shown in FIGS. 1B, at similar nanotube loading, aligned CNTs 113 in polystyrene 117 enhanced the stiffness by 5 times more than randomly distributed CNTs.

Accordingly, a scalable and economical method to disperse nanoparticles (e.g. carbon nanotubes) and control their alignment in polymeric and other mediums, particularly at an industrial scale, would be welcome in the art.

Thermoelectrics

Meanwhile, the development of thermoelectrics, materials that efficiently convert (waste) heat into pollution free electricity, is an essential energy need for today's society. Thermoelectric energy conversion represents a solid-state technology based on the "Thermoelectric effect", where a temperature gradient generates an electrical current. Conversely, cooling (refrigeration) can be achieved by applying electrical power across the material. The fundamental difficulty in creating efficient thermoelectric materials is that they must be very good in conducting electricity, but not heat. Only for such materials (electrically-conductive but thermally-insulating) a temperature gradient can be maintained across the material while electrons (or holes) diffuse to generate a current. These two properties, however, go hand in hand. Despite 70 years of research, remarkable enhancements in thermoelectrics have been obtained in the past 20 years via the nontraditional technology of nanostructuring.

In general, creating hierarchical structures that allow electron transfer but suppress phonon transport is a commonly practiced strategy to achieve efficient thermoelectrics. Recently, a new class of thermoelectrics based on organic materials has emerged. Organic materials (i.e., polymeric systems with carbon nanomaterials) benefit from many advantages over their inorganic counterparts. Specifically, organic thermoelectrics provide an opportunity for creating flexible modules and even fabrics that can be used in clothing, wearable electronics (e.g., body powered sensor systems for health), and as shapes that conform to complex objects. Moreover, organic thermoelectrics can be integrated into hybrid modules with organic photovoltaics (OPVs), increasing the efficiency of OPVs by converting solar heat into electricity.

The economics and efficiency of current thermoelectrics are not sufficient for commercial usage, and hence they are only found in niche applications such as body heat-powered watches and heating/cooling of seats in luxury brand cars. Moreover, they suffer from other barriers to widespread acceptance because of their difficulty in manufacturing, toxicity, prohibitive cost, and reliance on rare earth materials. While the first generation of thermoelectric devices is being commercialized, the next generation demands lie in designing cheaper and more efficient materials. To address these challenges, organic materials are a particularly attractive alternative to inorganic thermoelectrics, especially for refrigeration or waste heat recovery up to 200° C., in that they are cheap, safe, abundant, and can be produced using scalable roll-to-roll (R2R) processes. R2R refers to processes for creating electronics over flexible plastic substrates using printing, coating, or other scalable techniques.

CNTs are promising materials for thermoelectrics due to their extraordinary electrical properties, air stability, and mechanical flexibility. A single CNT has a flawless structure comprising hexagonal arrays of $sp^2$ connected carbon atoms and therefore has electrical and thermal conductivities on par with the best electrically and thermally conductive materials, respectively. When added as fillers to polymeric materials, CNTs can readily improve electrical properties of the host polymer, tuning it from insulating to conductive. On the contrary, improvement of thermal conductivity in CNT based composites is very minimal As such, CNT-polymer junctions allow electron transport but scatter phonons. Numerous studies have shown that properly engineered nanoscale structures and interfaces allow for the decoupled control of electrical and thermal conductivities in CNT networks and are therefore critical for realizing high ZT values.

Accordingly, methods for incorporating CNTs for use in thermoelectric would be a welcome addition in the art.

SUMMARY

In an embodiment, there is a method for forming a composite, comprising: mixing a plurality of carbon nanotubes (CNTs) and a plurality of magnetic nanoparticles in a non-polar medium, wherein at least some of the plurality of CNTs form entangled CNTs; attaching first ones of the plurality of magnetic nanoparticles to exposed surfaces of the entangled CNTs; disentangling the entangled CNTs to form a plurality of dispersed CNTs; and aligning the plurality of dispersed CNTs, wherein the disentangling of the entangled CNTs to form a plurality of dispersed CNTs comprises exposing the plurality of magnetic nanoparticles and the plurality of entangled CNTs to electromagnetic energy.

In another embodiment, there is a fiber reinforced polymer composite, comprising: a plurality of composite plies extending in a parallel-plane direction, a plurality of aligned carbon nanotubes (CNTs) extending across an inter-ply interface disposed between adjacent ones of the plurality of composite plies, and a plurality of nanoparticles bonded to surfaces of the plurality of aligned CNTs.

In another embodiment, there is a thermoelectric structure, comprising: a polymer interface layer; a first layer disposed on a first side of the polymer interface layer and comprising a plurality of aligned, wavy carbon nanotubes (CNTs), wherein the CNTs are vertically oriented to a surface of the polymer interface layer; a second layer disposed on a second side of the polymer interface layer and comprising a plurality of aligned, wavy CNTs, wherein the CNTs are vertically oriented to the surface of the polymer interface layer; and wherein at least some of the CNTs of the first layer and some of the plurality of CNTs of the second layer comprise defects.

In another embodiment, there is a method of making a thermoelectric structure, comprising: forming a first array of aligned carbon nanotubes (CNTs) on a first substrate, wherein the CNTs of the first array are vertically oriented to a surface of the first substrate; transferring the first array of aligned CNTs onto a second substrate, wherein the aligned CNTs of the first array are vertically oriented to a surface of the second substrate; removing the first substrate to expose ends of the aligned CNTs in the first array; and forming a first polymer layer on the exposed ends of the aligned CNTs, wherein the CNTs of the first array are vertically oriented to a surface of the first polymer layer.

Some embodiments provide for economically viable and scalable nano-manufacturing methods to disperse CNTs in different mediums and control their alignment.

Some embodiments provide for cheap and efficient solutions electricity generation from heat or cooling.

Advantages of the embodiments will be set forth in part in the description which follows, and in part will be understood from the description, or may be learned by practice of the invention. The advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

BRIEF DESCRIPTION OF THE DRAWINGS

FIGS. 2A-2C illustrate a method to disperse and align CNTs according to an embodiment.

FIG. 3B FIG. 2B is a flow-chart describing a method to disperse and align CNTs according to an embodiment.

DETAILED DESCRIPTION

Figure 1A:
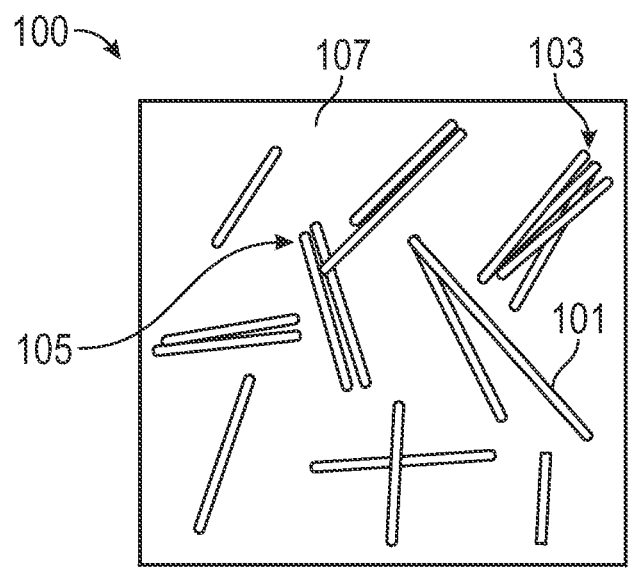
FIG. 1A-1B are typical (FIG. 1A) and ideal (FIG. 1B) CNT-polymer nanocomposites for enhanced mechanical properties.
Figure 1B:
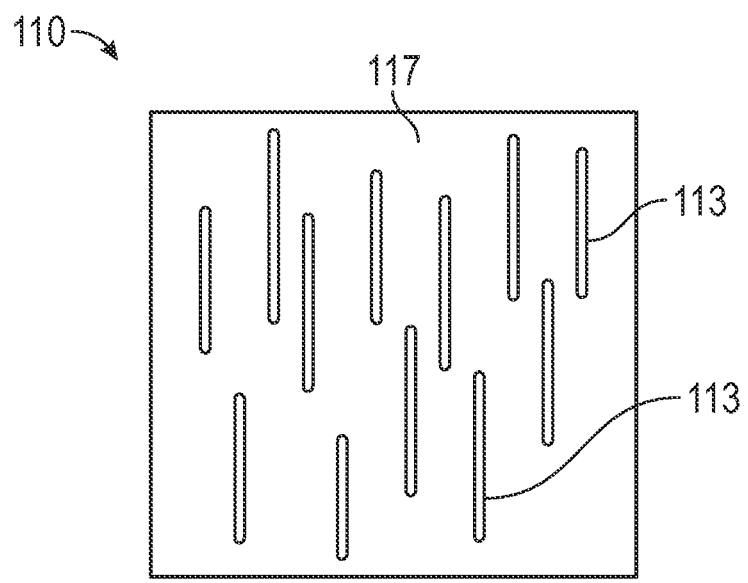

Reference will now be made in detail to the present embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

The following embodiments are described for illustrative purposes only with reference to the Figures. Those of skill in the art will appreciate that the following description is exemplary in nature, and that various modifications to the parameters set forth herein could be made without departing from the scope of the present invention. It is intended that the specification and examples be considered as examples only. The various embodiments are not necessarily mutually exclusive, as some embodiments can be combined with one or more other embodiments to form new embodiments.

I. Method of Dispersing Nanoparticles in Different Mediums

In a method of the present invention illustrated in FIGS. 2A-2C: i) CNTs 201 are mixed with a (non-polar) medium 207 containing magnetic nanoparticles (MNPs) 202 and may form entangled CNTs 203 as shown in FIG. 2A, ii) by engineering surface reactions, nanoparticles 202 may attach to surfaces of the CNTs 201, such as of outer ones of the CNTs in the CNT bundle, iii) microwaves 220 cause magnetic nanoparticles to spin, hence agitating the CNTs and disentangling them as disentangled CNTs 204 as shown in FIG. 2B, iv) excess magnetic nanoparticles (MNPs) may attach to the fresh CNT surfaces that have just been created, preventing their re-agglomeration, and v) dispersed CNTs 204 decorated with the magnetic nanoparticles 202 are easily aligned using external weak to moderate magnetic fields 230, such as the ones generated by permanent magnets, thereby forming aligned CNTs 213 as shown in FIG. 3. While embodiments described herein utilize carbon nanotubes, other nanostructures may be used, including: nanotubes, nanowire and/or nanorod in place of or in addition to the CNTs.

A. Carbon Nanotubes

The carbon nanotubes of an embodiment may be provided in the mixture with the nanoparticles. In an example, the carbon nanotubes may be provided in an amount of from greater than about 0 wt % up to about 5 wt %. The carbon nanotubes of the embodiments may be single and/or multi-walled nanotubes of any aspect ratio.

B. Nanoparticles

The nanoparticles may be magnetic nanoparticles. The magnetic nanoparticles may comprise any super-paramagnetic nanoparticles and may comprise iron, nickel, cobalt, their oxides and their alloys.

The nanoparticles may be charged nanoparticles. Charged nanoparticles may comprise magnetic nanoparticles coated with charged polymers. The nanoparticles may be functionalized. For example, the magnetic nanoparticles may be functionalized to contain a functional group that may react with a surface of a carbon nanotube, for example, through covalent or hydrogen bonding. In an example, the magnetic nanoparticles comprise a polymeric coating.

In an embodiment, the nanoparticles may attach to the nanotubes via van der walls forces. While not limited to any particular theory, it is believed that if the nanoparticles attach through van der walls forces to the nanotubes, application of a magnetic field, such as an AC magnetic field, can cause the nanoparticles to move and thereby align the nanotubes, for example, side-by-side. A distance between the aligned nanotubes can, therefore, be controlled by the size of the magnetic nanoparticles or the frequency of the AC magnetic filed used in the embodiments. Accordingly, in an embodiment. Accordingly, in an embodiment, the nanoparticles may be defined by at least one dimension that is smaller than or equal to 100 nm. In an embodiment, the nanoparticles may be included in the matrix in an amount of at least about 0.01 wt % to an amount that provides for the alignment of the nanotubes as described herein.

C. Matrix

The CNTs and nanoparticles may be mixed in a medium, for example, a non-polar medium. In some aspects, the medium may comprise a non-polar polymer or solvent. For example, the medium can be any polymer dissolved in a non-polar solvent or a molten polymer. When the CNTs and nanoparticles are combined in the matrix, the nanoparticles may react to decorate surfaces of CNTs.

In an embodiment, magnetic nanoparticles (e.g., iron oxide) can be synthesized via a co-precipitation method in which iron salts are dissolved in a solution and introduced into a basic environment at elevated temperatures. The magnetic nanoparticles can be then stabilized (coated), for example, with oleic acid, to form a coated magnetic nanoparticle (e.g., iron oxide core-oleic acid coating). The coating of the coated magnetic nanoparticles interacts with carbon nanotubes that are functionalized (carboxylated or hydroxylated) and a ligand exchange occurs. The oleic acid may be replaced with the functional groups on the sidewalls of CNTs. This connects the CNTs to the magnetic nanoparticle core, such as an iron oxide core. The magnetic nanoparticles may be placed in a non-polar solvent. For example, the magnetic nanoparticles may be stabilized in a Kerosene solution. Higher temperatures (~70C) may promote ligand exchange. Mechanical agitation and microwave energy absorption (by the nanotubes) may also promote ligand exchange and cause more nanoparticles to attach to the nanotubes D. Electromagnetic Energy In embodiments, electromagnetic energy may cause the nanoparticles to spin or move quickly, thereby agitating CNTs to which they are attached, which in turn agitates neighboring CNTs leading to a disentangling of entangled CNTs.

In an embodiment the electromagnetic energy is provided at frequencies which interact with the nanoparticles. In an example, the electromagnetic energy comprises microwave energy. While not limited to any particular theory, it is believed that the electromagnetic energy interacts with the magnetic nanoparticles. Accordingly, microwave exposure of the magnetic nanoparticles results in well-dispersed CNTs decorated with magnetic nanoparticles, which can later be aligned in an external magnetic field. Thus, in an embodiment, the matrix material may also be selected so that it is transparent to magnetic fields.

E. External Magnetic Field

External magnetic fields with strength as low as 0.001 Tesla can be applied to align nanotubes. Alternating magnetic fields can be applied to place the nanotubes on which nanoparticles are attached at corresponding distances from one another in a 2D fashion.

In an embodiment, the nanoparticles remain attached to the carbon nanotubes. In some embodiments, however, the nanoparticles may be washed away after the nanotubes are aligned. For example, aligned nanotubes that do not have nanoparticles attached thereto may be used in applications such as for field effect transistors and, therefore, the nanoparticles must be washed away prior to incorporation of such nanotubes in the field effect transistors.

Figure 3A:
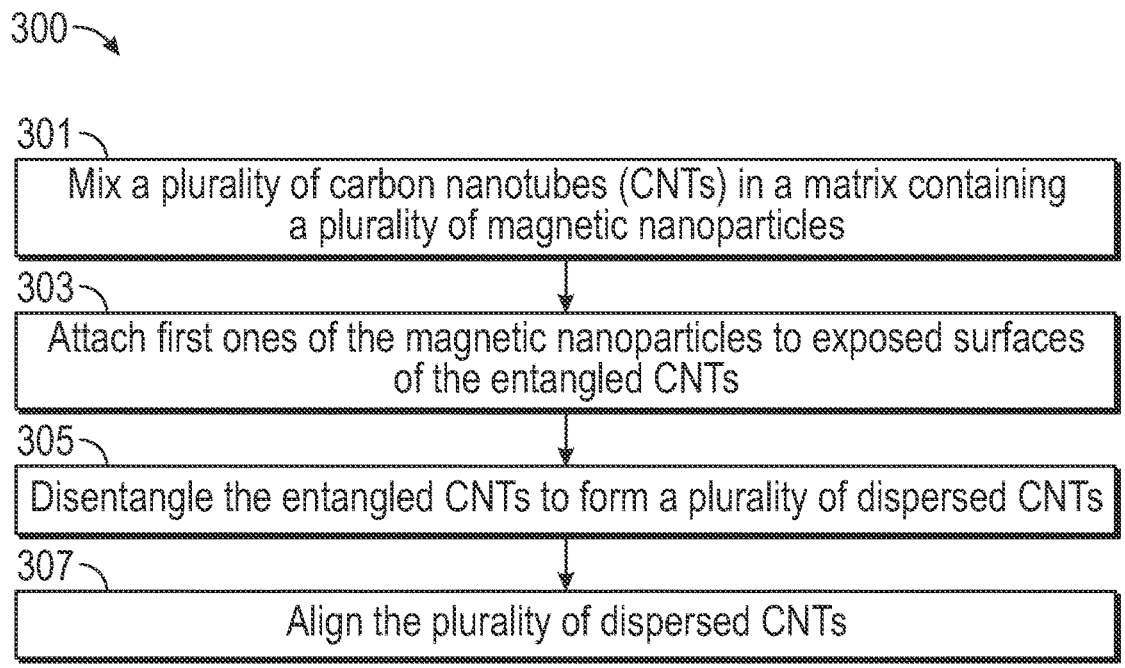
FIG. 3A is a flow-chart describing a method to disperse and align CNTs according to an embodiment.
Figure 3B:
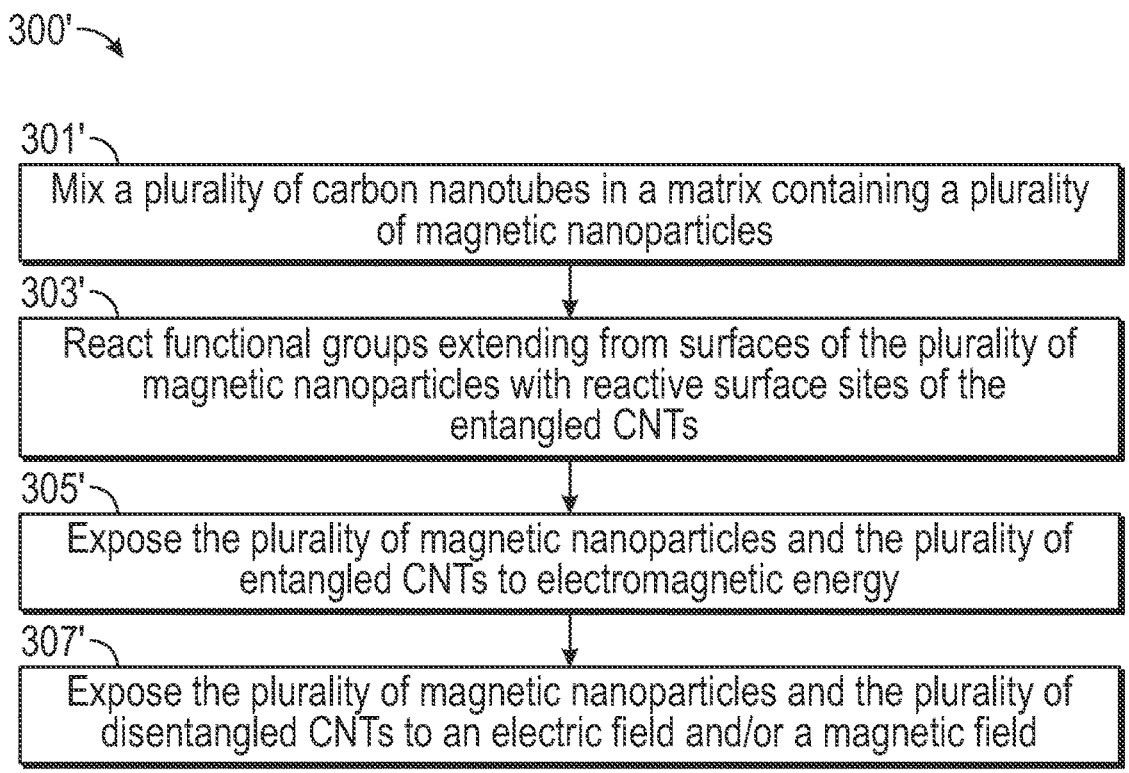

In summary, as shown in the flowchart of FIG. 3A, a method 300 for forming a composite can include: mixing a plurality of carbon nanotubes (CNTs) and a plurality of magnetic nanoparticles in a matrix, wherein at least some of the plurality of CNTs form entangled CNTs at 301; attaching first ones of the plurality of magnetic nanoparticles to exposed surfaces of the entangled CNTs at 303; disentangling the entangled CNTs to form a plurality of dispersed CNTs at 305; and aligning the plurality of dispersed CNTs at 307. More specifically, as shown in the flow chart of FIG. 3B, a method 300' for forming a composite can include mixing a plurality of carbon nanotubes (CNTs) and a plurality of magnetic nanoparticles in a matrix, wherein at least some of the plurality of CNTs form entangled CNTs at 301; reacting functional groups extending from surfaces of the plurality of magnetic nanoparticles with reactive surface sites of the entangled CNTs at 303'; exposing the plurality of magnetic nanoparticles and the plurality of entangled CNTs to electromagnetic energy at 305'; and exposing the plurality of magnetic nanoparticles and the plurality of disentangled CNTs to an electric field and/or a magnetic field at 307'.

Figure 4:
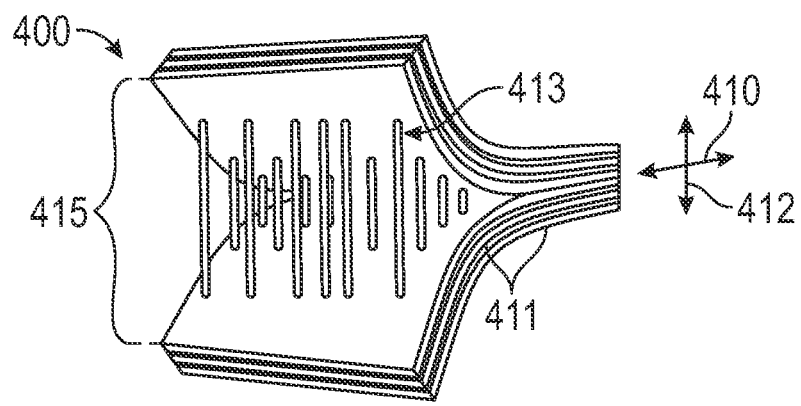
FIG. 4 is a perspective view of a fiber reinforced polymer (FRP) composite according to an embodiment. CNTs aligned in a cross-planar direction (i.e., z-direction) bridge between different composite plies.

Such methods may be used for forming an FRP having a plurality of aligned CNTs that are aligned in the cross-plane direction. While not limited to any particular theory, it is believed that methods of aligning CNTs for use in an FRP provide for anisotropic strengthening that allows for improved properties in desired (weak) directions in a composite and, therefore, smaller loadings of CNTs are required. In one embodiment, an FRP 400 is shown in FIG. 4. FRP 400 comprises a plurality of composite plies 411 extending in a parallel-plane 410 direction, a plurality of aligned carbon nanotubes (CNTs) 413 extending across an inter-ply interface 415 (shown as a zoomed-in perspective view) disposed between adjacent ones of the plurality of composite plies 411. It is noted that aligned CNTs, such as those made according to the method described in FIGS. 2A-2C and FIGS. 3A-3B, with or without the nanoparticles washed away after the nanotubes are aligned, may be used in the FRP of FIG. 4. Accordingly, the FRP 400 may include a plurality of nanoparticles bonded to surfaces of the plurality of aligned CNTs. The aligned CNTs 313 may act as nanobridges, stitching the laminates/plies 411 at their weak inter-ply interfaces 415, thus strengthening the interlaminar fracture resistance (delamination resistance). In one aspect, the use of aligned CNTs 413 in FRP 400 significantly improves the cross-plane electrical conductivity. Thus, embodiments described herein may provide for industrial scale production of the next-generation FRP composites with improved mechanical properties and structural health monitoring (SHM) capabilities.

II. Methods to Achieve Superior Thermoelectric Performances in Carbon Nanotube Polymer Systems As used herein "nano-scale" refers to dimensions equal to or lower than 100 nanometers, while "micro-scale" refers to features that are larger than 100 nanometers and smaller than 100 microns.

Aligned CNTs present an interesting alternative for thermoelectric materials where they possess very high and anisotropic electrical conductivity and a tunable Seebeck coefficient (required for a high thermoelectric efficiency). Their thermal conductivity is, however, too high for a thermoelectric material. Thermal conductivity of single CNTs has been reported to be ~3000 W/mK or higher at room temperature. CNT-CNT interfaces scatter heat carriers significantly. For example, one, two, and three-dimensional CNT networks can have thermal conductivities of approximately 250, 50, and 3 W/mK, respectively. The reduced trend in thermal conductivities is due to the increased point contacts between individual CNTs in higher dimensional networks leading to increased interfacial thermal (also called Kapitza) resistance. Similarly, reduction in the thermal conductivity of individual tubes can be achieved by introducing defects, such as isotopes, vacancies, dopants, etc., in their structures. Accordingly, it has been discovered that high thermal conductivity can be significantly reduced while maintaining a high Seebeck coefficient and electrical conductivity by controlling atomic-, nano-, and micro-scale structures in CNT networks.

Additionally, vertically aligned CNTs offer many advantages over randomly dispersed CNTs and are especially suitable for thermoelectric. For example, 1D CNT assemblies attain a higher electrical conductivity compared to 2D and 3D networks. Also, stable CNT structures can be controlled at the atomic, nano, and micro-scales. For example, at the atomic-scale, chemical or physical methods can introduce modifications to CNT surfaces; at the nano-scale, CNT size, packing density and CNT-CNT contact points which can be used to tune electrical and thermal properties of CNT arrays may be controlled via adjusting synthesis parameters; and at the micro-scale, CNT length can be readily adjusted by changing the synthesis duration. Furthermore, stable CNT structures allow for doping and introducing defects. On one hand, defects can contribute to a reduced thermal conductivity while doping achieves both n- and p-type electrical characteristics required for thermoelectric modules.

Figure 5:
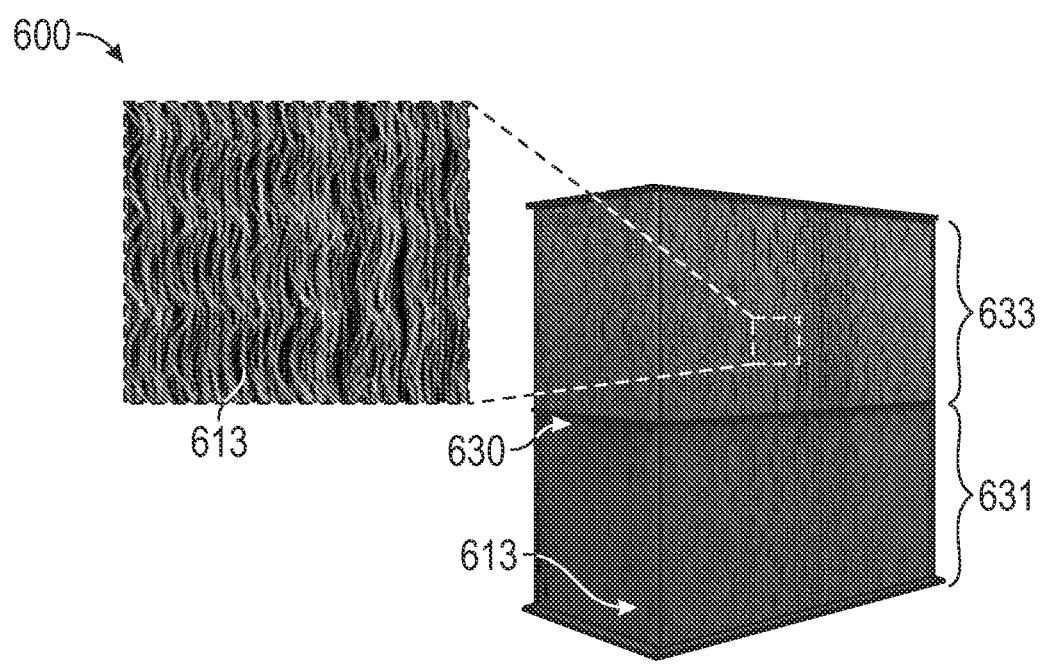
FIG. 5 is a perspective view of a multilayer structure comprising vertically aligned carbon nanotubes and polymer interface layers according to an embodiment.

The methods of the present invention reduce the thermal conductivity of aligned CNTs by introducing very small amount of defects and waviness along their length. The present embodiments also provide for a multilayer hierarchical CNT-polymer structure which is formed via independent variation of structures at atomic-, nano-, and micro-scales which provide for increased thermoelectric efficiencies. While not limited to any particular theory, it is believed that defects in small amount reduce the thermal conductivity of CNTs while inducing only minimal effect on their electrical conductivity. While not limited to any particular theory, it is believed that inducing waviness along the length of CNTs in a CNT array control the point contacts between the CNTs and therefore reduce their thermal conductivity. Lastly, engineered CNT-polymer interfaces (as shown in FIG. 5) further reduce the thermal conductivity and enable a high thermoelectric efficiency. Additionally, methods of the embodiments provide for carbon nanotube (CNT)-based polymer composites that are used to construct tailored hierarchical assemblies that function as high performance thermoelectric materials. While not limited to any particular theory, as the CNT-based polymer composites comprise non-metals, the contribution of electrons to thermal conduction is assumed to be negligible. A figure of merit (ZT) of 1 or higher is required for the commercialization of thermoelectric materials, and the methods of the embodiments achieve CNT-polymer fabrics with a ZT of 1, realizing a long-sought breakthrough in the area of "flexible thermoelectrics".

A. Multi-Layer Thermoelectric Structure

In an embodiment shown in FIG. 5, a thermoelectric structure 600 comprises a multilayer hierarchical assembly of vertically aligned CNTs 613 separated by polymer. While FIG. 5 shows a two-layer embodiment (i.e., a first layer 631 of aligned CNTs and a second layer 633 of aligned CNTs, and a polymer interface layer 630 disposed between the first layer 631 and the second layer 632), the number of layers can be increased. Accordingly, multilayer assemblies for the thermoelectric structures described herein may have additional layers of aligned CNTs and may have additional polymer interface layers.

An objective of the embodiments described herein is to create multilayer CNT-polymer structures, such as structure 600, with structural features that are larger than electron mean free path (which allow electron transfer), but still smaller than phonon mean free path (suppress phonon transport), in order to increase ZT. Moreover, phonon scattering at CNT-polymer and CNT-CNT interfaces as well as defect sites are also employed to further reduce the thermal conductivity. As is known to those of ordinary skill in the art, thermal conductivity of CNTs significantly decreases with increasing CNT diameter and decreasing CNT length. Accordingly, in an embodiment the multilayer structure 600 can include CNTs having different diameters, for example, single-walled and multi-walled CNTs, and CNTs having different lengths. In an embodiment, such as a multi-layer structure, CNTs in one layer may have different lengths and/or different diameters than CNTs of a different layer in the structure. Additionally, the polymer interface layer (thickness and properties) affects all thermoelectric properties. Accordingly, CNT diameter and length, polymer thickness and properties, CNT waviness, and CNT doping may be adjusted, as described below, to tune the thermoelectric properties. Atomic-scale defects may be introduced in CNTs via chemical and physical methods, nanoscale interfaces may be created by controlling CNTs waviness and through controlled polymer infusion at the layer interfaces, and micro-scale structures may be controlled by simply adjusting the length of grown CNT layers.

Accordingly, the CNTs 613 in the structure 600 may be straight and/or wavy CNTs. That is, the CNTs may be substantially linear or may have at least one curved portion between ends thereof. The CNTs may comprise various degrees of waviness (i.e., low, medium and high waviness).The CNTs 613 may have lengths in the range of from about 100 μm to about a few millimeters.

Also, the polymer of the interface layer 630 may be selected from any conjugated polymer family including poly(thiophine)s, poly(pyrrole)s, poly(acetylene)s, poly(p-pheneylenevinylene), e.g., poly(3,4-ethylenedioxythiophene):poly(stryrenesulfonate) (PEDOT: PSS), P3HT [Poly (3-hexylthiophene-2,5-diyl)], polyanilines (PANI). PEDOT: PSS in particular may be selected for the interface layers because it readily interacts with CNTs through π-π stacking, and wraps around the CNTs Also, PEDOT:PSS possesses a favorable low intrinsic thermal conductivity (0.1-0.3 W/mK), and a moderately high and tunable electrical conductivity (values between 2-500 S/cm are readily achieved by adding some high boiling solvent to the pre-deposition solution of this polymer). Dimethyl sulfoxide (DMSO) may be added to the precast solution of PEDOT:PSS to achieve different electrical properties for the interface layer (0, 3, and 5% DMSO can be added to achieve low, medium and very high conductivities). The thickness of the polymer-interface layer 630 may be changed by varying the spin-coating speed or alternatively by spray coating processes. In an embodiment, the polymer interface layer 630 may have a thickness of 200 nm or may have a thickness of just a few nanometers. Accordingly, the polymer interface layer 630 may have a thickness of at least 2 nm, for example, from about 2 nm to about 200 nm, such as from about 10 to about 200 nm.

B. Method of Making Multi-layer Thermoelectric Structure

The CNTs of the embodiments can be grown by any suitable synthesis methods that enable growing vertically aligned CNTs, such as those that are anchored to a substrate. CNTs of the embodiments may be synthesized or they may be purchased (for example, NANOPRO™ available from General Nano, LLC of Cincinnati, Ohio). Catalytic chemical vapor deposition (CCVD) is the most readily scalable and least expensive route to grow VACNTs and has been shown to effectively grow high quality CNTs of various diameters and lengths using different catalysts and over different substrates.

Figure 6:
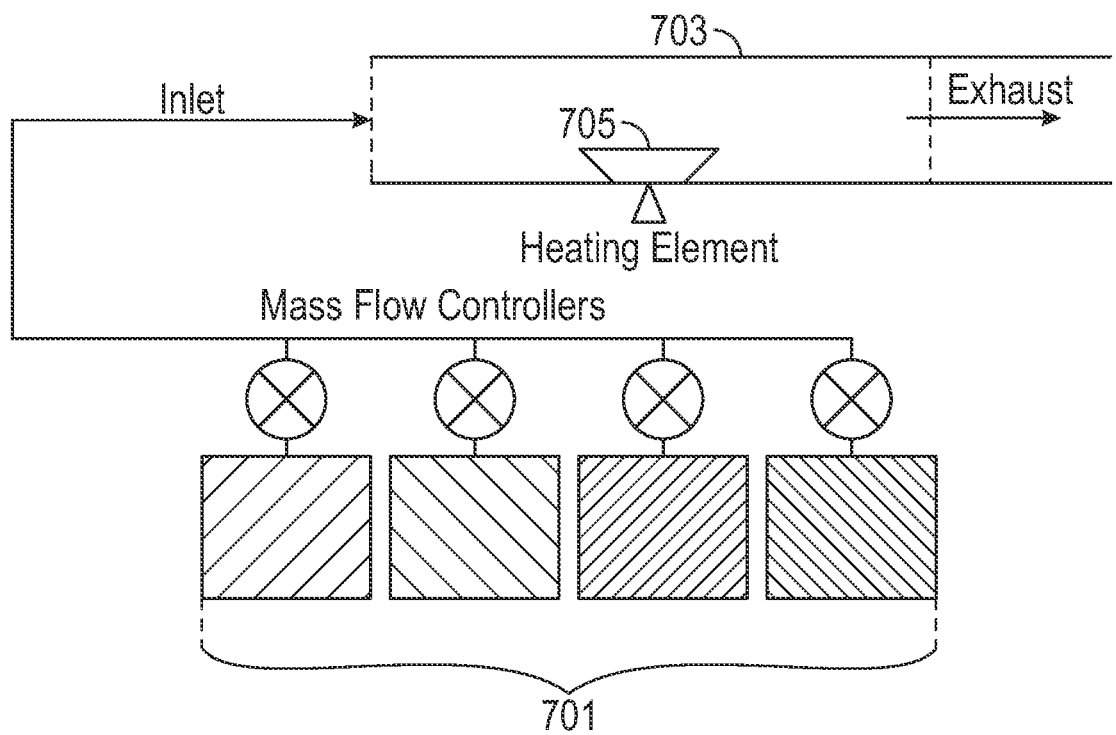
FIG. 6 illustrates an arrangement for the synthesis of carbon nanotubes according to an embodiment.

In a CCVD of the embodiments as shown in FIG. 6, gases 701 (which may include, among others, an inert gas such as nitrogen, a hydrocarbon source such as methane, and hydrogen as a reducing agent) are provided to a chamber 703, such as tube furnace. The gases 701 flow over a substrate 705 on which nano-sized catalyst particles (not visible) are disposed at high temperatures (e.g., 500-1200° C.) and controlled low pressures, and carbon nanotubes chemically deposit onto the substrate 705.

In an example, intrinsic silicon wafers may be selected as the substrate 705 since they are inexpensive, flat, and suitable for CNT growth. Initially a 20 nm thermal oxide may be grown on the wafers to esoterically insulate the substrate from the Polymer-CNT thermoelectric materials later to be fabricated. A few nanometers-thick catalyst (iron or nickel) layer may be deposited onto the substrate by physical vapor sputtering. Heat treatment of this thin film over the silicon substrate may result in forming nano-islands, which may later serve as the catalyst for CNT growth. The size of the catalyst particles determines the size of the resulting CNTs, and the sizes may be adjusted by changing the initial thickness of the deposited catalyst layer. CNT arrays may be grown on ultra-thin silicon wafers (20 to 125 micron thick) with different lengths, waviness, and diameter. Such CCVD grown CNTs have a catalyst particle attached to their tip. This particle is removed by simple acid treatment or plasma etching if needed.

Length of the CNTs of the embodiment may be controlled by synthesis duration and flow rates of the gases 701. CNT Waviness and CNT diameter may be controlled through catalyst size, growth temperatures and flow rates flow rates of the gases 701. Lastly, defects may be introduced by either plasma treatment or by doping with molecular dopants such as Tetracyanoquinodimethane (TCNQ) and Tetraphenylporphyrin (TPP). In an example, plasma treatment may include introducing a low power $O_2$ plasma to induce atomic scale defects in the carbon nanotubes. However, one benefit of using molecular dopants to introduce the defects lies in their ability to readily change the Seebeck coefficient of CNTs. For example, TCNQ and tpp achieve p- and n-type doping for CNTs, respectively. However, depending on the amount of dopant, thermal conductivity of CNTs may be adversely increased. After fabrication of the vertically aligned CNT network, the polymer may be spray coated (or spin coated) on wafers to attain a thin film polymer-CNT structure.

Figure 7A:
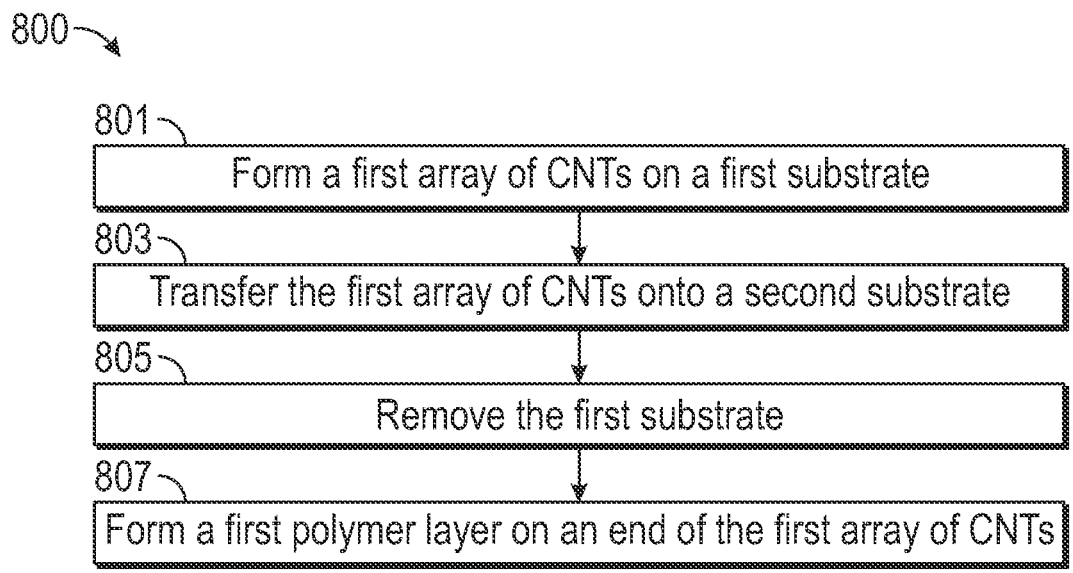
FIGS. 7A-7B are flowcharts describing methods for forming multilayer structures according to an embodiment.
Figure 7B:
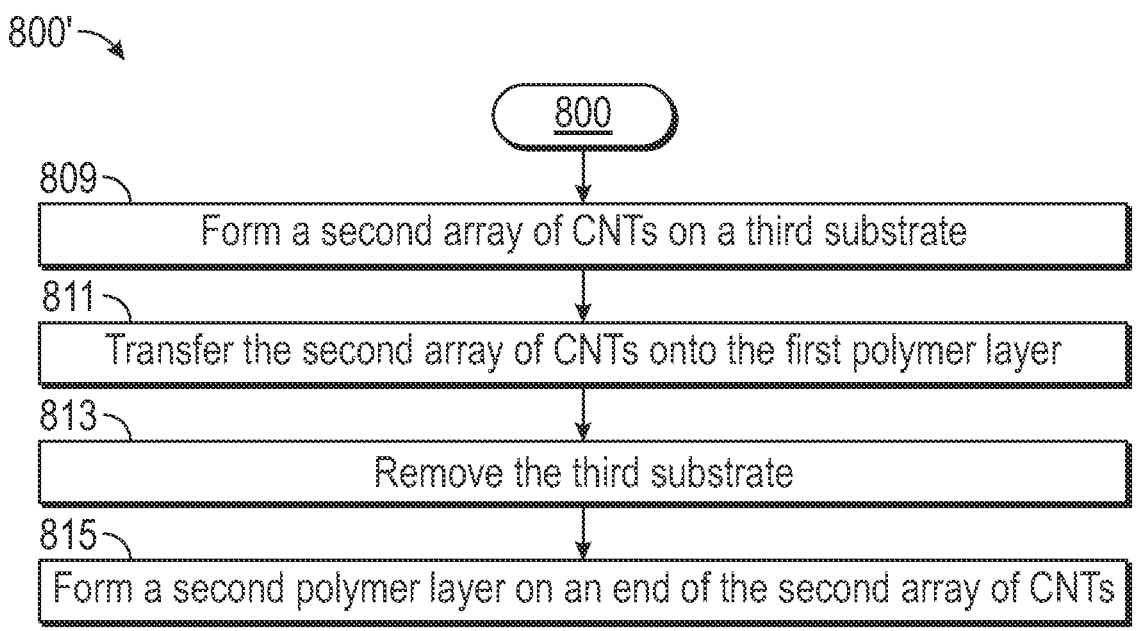

Multilayer CNT-polymer structures may be fabricated according to a method described in the flow charts 800, 800' of FIGS. 7A-7B. For example, as shown in FIG. 7A, such a method may include forming a first array of vertically aligned carbon nanotubes (CNTs) on a first substrate at 801 (i.e., the CNTs are vertically oriented to a surface of the first substrate); transferring the first array of vertically aligned CNTs onto a second substrate at 803 (i.e., the CNTs are vertically oriented to a surface of the second substrate); removing the first substrate to expose ends of the CNTs in the first array at 805; and forming a first polymer layer on the exposed ends of the CNTs of the first array at 807, for example, such that the CNTs of the first array are vertically oriented to a surface of the first polymer layer. As shown in FIG. 7B, the method may further include forming a second array of vertically aligned CNTs on a third substrate at 809 (i.e., the CNTs of the second array are vertically oriented to a surface of the third substrate); transferring the second array of CNTs onto the first polymer layer at 811, for example, such that the CNTs of the second array are vertically oriented to a surface of the first polymer layer); removing the third substrate to expose ends of the CNTs in the second array at 813; and forming a second polymer layer on an end of the second array of CNTs at 815, for example, such that the CNTs of the second array are vertically oriented to a surface of the second polymer layer.

Figure 8A:
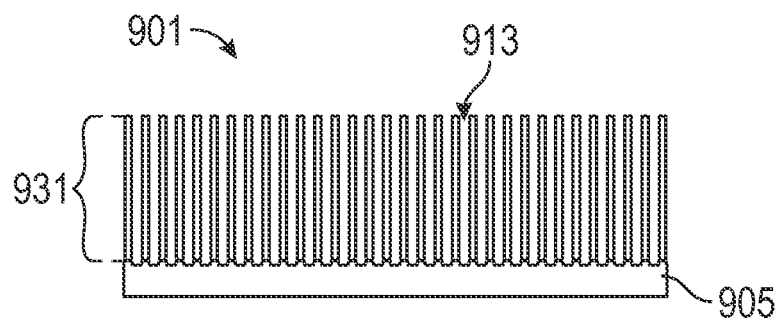
FIG. 8A-8G illustrates a process for forming multilayer structures according to an embodiment.
Figure 8B:
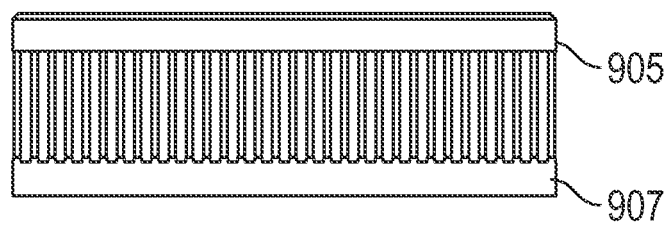

The methods of FIGS. 7A-7B may be implemented as described with reference to FIGS. 8A-8F. For example, as shown in FIG. 8A, a first array 931 of aligned CNTs is grown over an ultra-thin Si wafer 905, for example, by CCVD. That is, the CNTs of the first array may be vertically aligned to a surface of the first substrate (here, the Si Wafer 905). Thinner Si wafers may be chosen as the substrate on which the CNTs are grown because they serve as sacrificial substrates which are removed in subsequent steps as described below. First, however, the first array of CNTs 931 is stamped on a sapphire wafer 907 such that it is sandwiched between the silicon wafer 905 and the sapphire wafer 907 (as shown in FIG. 8B). That is, the first array of CNTs may be vertically oriented to a surface of a second substrate (here, the sapphire wafer 907). The first array 931 of CNTs can be strongly bonded to sapphire. The sapphire wafer is ideal for use as a substrate for thermoelectric characterization of thin films, since it features a flat surface and is an ideal electrical insulator with a high thermal conductivity. It is noted, however, that a gold substrate may be used in place of the sapphire substrate.

Figure 8C:
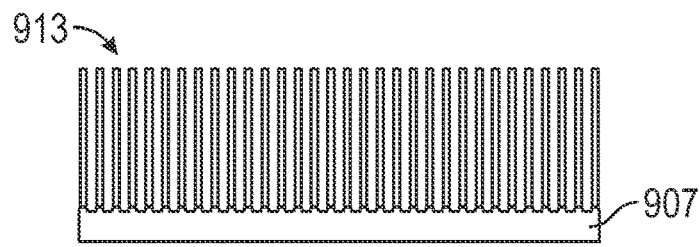
Figure 8D:
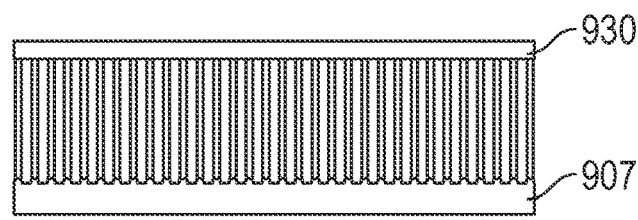

Next, the Si substrate 905 is fully etched and removed in $XeF_2$ gas as shown in FIG. 8C. XeF2 gas may be used as the etchant because it is minimally attacks sapphire and does not interact with polymers (which are usually used as masks in $XeF_2$ etching). A first polymer layer 930, such as PEDOT: PSS may be formed on an end of the CNTs in the first array 931 as shown in FIG. 8D such that the CNTs are sandwiched between the sapphire wafer 907 and the polymer 930. For example, the first array of CNTs may be vertically oriented to a surface of the polymer 930 (here, PEDOT:PSS). The PEDOT:PSS may be deposited via spin coating or spray coating.

Figure 8E:
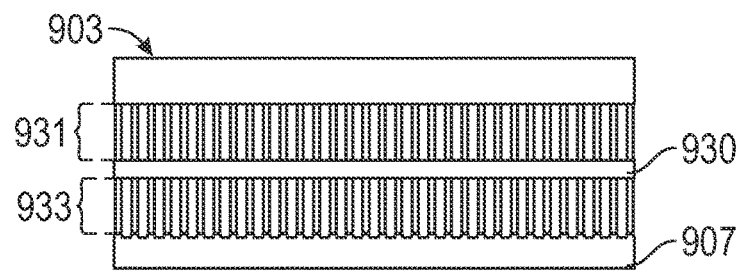
Figure 8F:
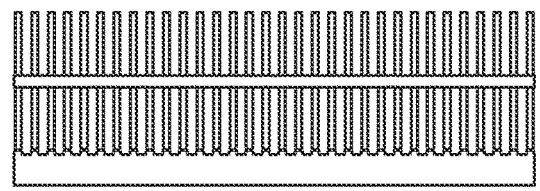
Figure 8G:
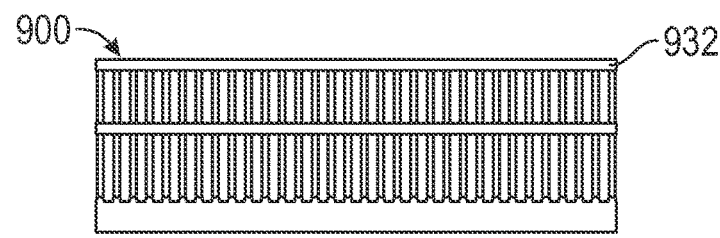

In a similar fashion, other layers of CNTs and polymers may stacked on top of one another to construct a multilayered thermoelectric material in which all the CNTs feature desirable alignment, density, periodicity, length and waviness. For example, as shown in FIG. 8E, a second array 933 of CNTs may be formed on another silicon wafer 903 (the second array of CNTS may be vertically oriented to a surface of the silicon wafer 903) and then transferred onto the polymer layer 930, such as by stamping. In an example, the second array of CNTs may be vertically oriented to a surface of the first polymer layer (here polymer layer 930). The silicon wafer 903 may then be removed by etching, for example, with $XeF_2$ gas, as shown in FIG. 8F. A second polymer layer 932, such as PEDOT:PSS, may be formed on an end of the CNTs in the first array 931 as shown in FIG. 8G such that the CNTs of the second array 933 are sandwiched between the first polymer 930 and the second polymer 932. That is, the second array of CNTs may be vertically oriented to a surface of the second polymer layer.

Upon removal of silicon, thermal annealing may implemented to ensure the diffusion of CNTs in the polymer layers and adhesion between the different layers. Accordingly, structure 900 with a plurality of layers (depending on the thicknesses of CNT and polymer players) may be fabricated.

In an embodiment, multilayer CNT-polymer structures may be fabricated according to a method described in the flow charts 800, 800' of FIGS. 7A-7B and implemented according to the steps shown in FIGS. 8A-8G as described above, except that the nanotubes may be detached from the (silicon) substrate and may be stacked them on top of one another without the need for XeF2 etching.

While the invention has been illustrated respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function.

Furthermore, to the extent that the terms "including", "includes", "having", "has", "with", or variants thereof are used in either the detailed description and the claims, such terms are intended to be inclusive in a manner similar to the term "comprising." As used herein, the phrase "one or more of", for example, A, B, and C means any of the following: either A, B, or C alone; or combinations of two, such as A and B, B and C, and A and C; or combinations of three A, B and C.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A fiber reinforced polymer composite, comprising:
a plurality of composite plies extending in a parallel-plane direction, wherein each composite ply comprises a plurality of continuous microfibers aligned in the parallel-plane direction,
a plurality of aligned carbon nanotubes (CNTs) extending across an inter-ply interface disposed between adjacent ones of the plurality of composite plies, wherein each of the aligned carbon nanotubes extends into the composite ply on each side of the inter-ply interface, and
a plurality of magnetic nanoparticles bonded to surfaces of the plurality of aligned CNTs, wherein the plurality of magnetic nanoparticles comprise a coating comprising a charged polymer.

2. The fiber reinforced polymer composite of claim 1, wherein the plurality of aligned carbon nanotubes comprise up to about 5% by weight of the fiber reinforced polymer composite.

3. The fiber reinforced polymer composite of claim 1, wherein the plurality of aligned carbon nanotubes comprise single walled carbon nanotubes, multi-walled carbon nanotubes, or a combination thereof.

4. The fiber reinforced polymer composite of claim 1, wherein the magnetic nanoparticles comprise iron, nickel, or cobalt.

5. The fiber reinforced polymer composite of claim 1, wherein the magnetic nanoparticles comprise iron oxide.

6. The fiber reinforced polymer composite of claim 1, wherein the magnetic nanoparticles comprise a functional group that reacts with surfaces of the plurality of aligned carbon nanotubes.

7. The fiber reinforced polymer composite of claim 1, wherein the plurality of magnetic nanoparticles are bonded to surfaces of the plurality of aligned CNTs by van der walls forces.

8. The fiber reinforced polymer composite of claim 1, wherein magnetic nanoparticles comprise an amount of at least about 0.01 wt % of the fiber reinforced polymer composite.

9. The fiber reinforced polymer composite of claim 1, wherein the fiber reinforced polymer composite comprises an improved cross-plane electrical conductivity compared to a fiber reinforced polymer composite without the plurality of aligned carbon nanotubes extending across the inter-ply interface disposed between adjacent ones of the plurality of composite plies.

10. The fiber reinforced polymer composite of claim 1, wherein the fiber reinforced polymer composite comprises an improved delamination resistance compared to a fiber reinforced polymer composite without the plurality of aligned carbon nanotubes extending across the inter-ply interface disposed between adjacent ones of the plurality of composite plies.

11. A fiber reinforced polymer composite, comprising:
a plurality of composite plies extending in a parallel-plane direction, wherein each composite ply comprises a plurality of continuous microfibers aligned in the parallel-plane direction,
a plurality of aligned carbon nanotubes (CNTs) extending across an inter-ply interface disposed between adjacent ones of the plurality of composite plies, wherein each of the aligned carbon nanotubes extends into the composite ply on each side of the inter-ply interface, and
a plurality of magnetic nanoparticles bonded to surfaces of the plurality of aligned CNTs, wherein the plurality of magnetic nanoparticles comprise a functional group that reacts with surfaces of the plurality of aligned carbon nanotubes.

12. The fiber reinforced polymer composite of claim 11, wherein the plurality of aligned carbon nanotubes comprise up to about 5% by weight of the fiber reinforced polymer composite.

13. The fiber reinforced polymer composite of claim 11, wherein the plurality of aligned carbon nanotubes comprise single walled carbon nanotubes, multi-walled carbon nanotubes, or a combination thereof.

14. The fiber reinforced polymer composite of claim 11, wherein the magnetic nanoparticles comprise iron, nickel, or cobalt.

15. The fiber reinforced polymer composite of claim 11, wherein the magnetic nanoparticles comprise iron oxide.

16. The fiber reinforced polymer composite of claim 11, wherein the plurality of magnetic nanoparticles comprise a coating comprising a charged polymer.

17. The fiber reinforced polymer composite of claim 11, wherein the plurality of magnetic nanoparticles are bonded to surfaces of the plurality of aligned CNTs by van der walls forces.

18. The fiber reinforced polymer composite of claim 11, wherein magnetic nanoparticles comprise an amount of at least about 0.01 wt % of the fiber reinforced polymer composite.

19. The fiber reinforced polymer composite of claim 11, wherein the fiber reinforced polymer composite comprises an improved cross-plane electrical conductivity compared to a fiber reinforced polymer composite without the plurality of aligned carbon nanotubes extending across the inter-ply interface disposed between adjacent ones of the plurality of composite plies.

20. The fiber reinforced polymer composite of claim 11, wherein the fiber reinforced polymer composite comprises an improved delamination resistance compared to a fiber reinforced polymer composite without the plurality of aligned carbon nanotubes extending across the inter-ply interface disposed between adjacent ones of the plurality of composite plies.

\* \* \* \* \*